United States Patent [19]

Benes

[11] 4,264,866
[45] Apr. 28, 1981

[54] FREQUENCY AND PHASE COMPARATOR

[76] Inventor: Ladislav Benes, 106 Seger Ave., Clifton, N.J. 07011

[21] Appl. No.: 900

[22] Filed: Jan. 4, 1979

[51] Int. Cl.³ .............................................. A03K 5/26
[52] U.S. Cl. .................................. 328/134; 307/526; 30/516; 328/110
[58] Field of Search ............... 328/109, 110, 118, 133, 328/134, 140, 141; 307/232

[56] References Cited

U.S. PATENT DOCUMENTS

| | | | |
|---|---|---|---|
| 3,576,497 | 4/1971 | Miller | 328/109 |
| 3,610,982 | 10/1971 | Rall | 328/133 X |
| 4,135,161 | 1/1979 | Torrieri | 307/232 |

*Primary Examiner*—John S. Heyman

[57] ABSTRACT

First and second triggered D type flip flops activated by input signal pulses and input reference pulses control first and second pulse generating circuits, a set/reset latch, and a clock input of a third edge triggered D type flip flop. A three input exclusive-or gate connected to the first and second edge triggered D type flip flop and to the set/reset latch is active on the data input of the third edge triggered D type flip flop for producing a sign signal of difference frequency. First and second gating circuits and an adding circuit are controlled by the sign signal for producing output pulses of difference frequency. First, second, third, and forth edge triggered pulse generating circuits activated by the first and second edge triggered D type flip flops and the set/reset latch produce pulses, which are distributed by an electronic combinational switch to operate first and second combinational set/reset latches for producing output two phase pulses of difference frequency.

15 Claims, 16 Drawing Figures

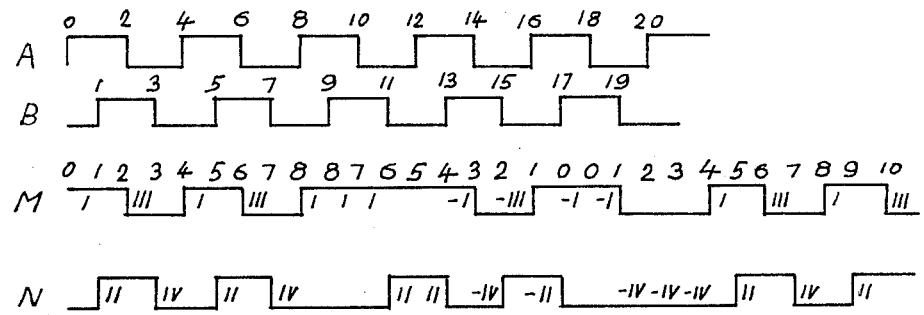
FIG. 13.
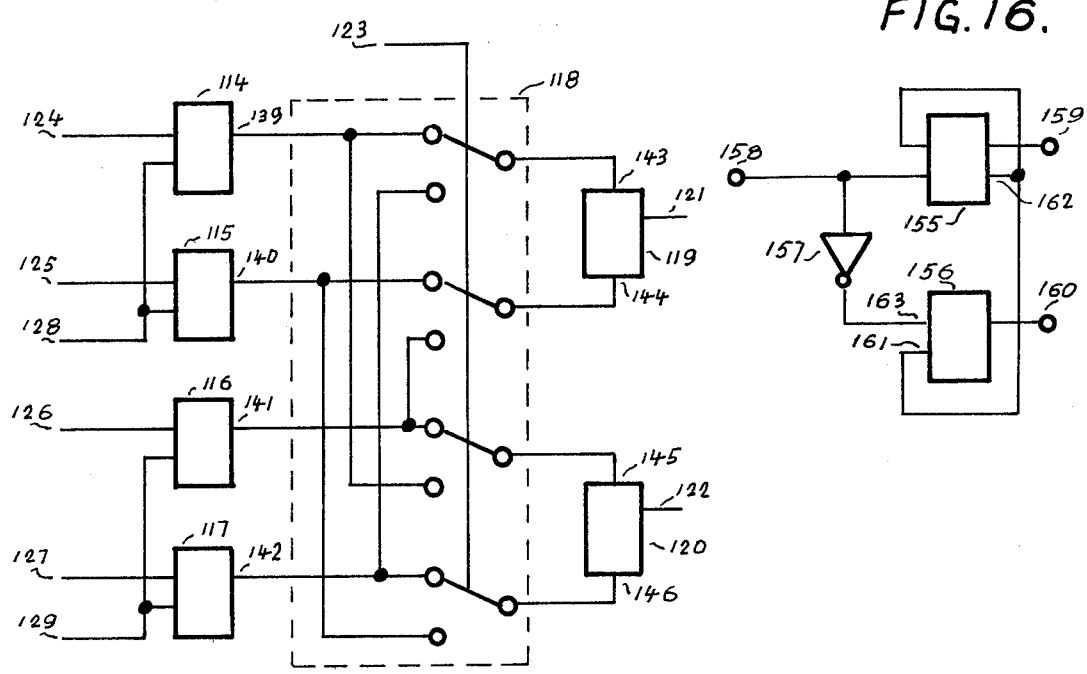
FIG. 11.
FIG. 16.
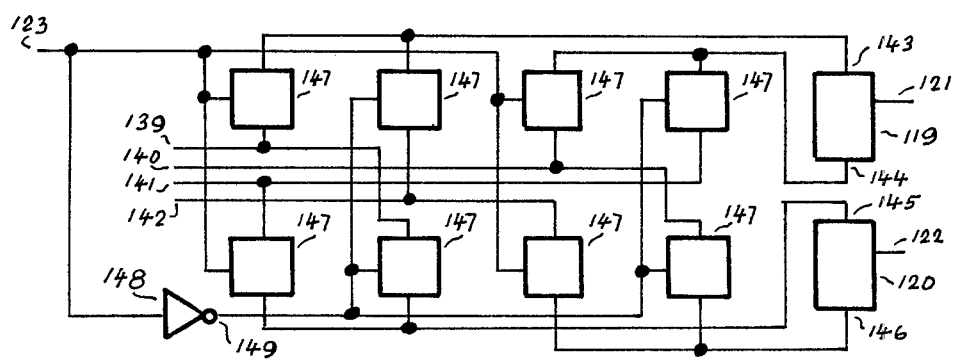
FIG. 14.

FREQUENCY AND PHASE COMPARATOR

This invention relates to pulse frequency comparator, pulse phase comparator, frequency and phase shift detector, measuring and controlling circuits based on frequency and phase shift detectors.

Detection of frequency and phase differences finds wide use in many measuring and controlling methods, because it is very easy to convert many physical quantites to frequency and phase changes. It is well known that frequency and phase comparators have two input terminals, first one of them for applying input reference pulses and second one of them for applying input signal pulses. Sometimes, frequencies of both input pulses are changing, but from the point of view of comparator function the input pulses applied to one input terminal are considered having input reference frequency and the input pulses applied to other input terminal are considered having input signal frequency. Input signal pulses having the same frequency as the input reference pulses, but changing their phase in respect to the input reference pulses introduce input phase signal. The phase of input signal pulses may being changed over several periods of the input reference pulses in positive or negative direction.

It is an important object of this invention to provide frequency and phase comparator comprising a new combination of electronic logic elements, edge triggered D type flip flops, set/reset latches, pulse generating circuits, and gates, which compares frequencies and phases of input reference pulses and input signal pulses and which has an output terminal producing a sign signal indicating that the frequency of input signal pulses is lower or higher than the frequency of input reference pulses, further an output terminal producing output pulses of difference frequency when the difference frequency has positive sign and an output terminal producing output pulses of difference frequency when the difference frequency has negative sign.

Another object of this invention is frequency and phase comparator comprising logic elements and an output terminal, herein there are produced output pulses of difference frequency regardless of the sign signal.

Another object of this invention is frequency and phase comparator comprising further logic elements, edge triggered pulse generating circuits, an electronic combinational switch, combinational set/reset latches, and a pair of output terminals producing output two phase pulses having difference frequency and phase shift, which is positive or negative in accordance with the sign signal.

Another object of this invention is frequency and phase comparator which respond to phase shifting of input signal pulses and wherein the sign signal indicates the direction of the phase shifting and wherein there are pulses on other output terminals, which are related and proportional to the number of periods of the input reference pulses crossed by input signal pulses during the phase shifting.

Still another object of this invention is frequency and phase comparator, which prevents the outputs being influenced by noise as far as the period variations caused by the noise are smaller than a quarter period of the input reference pulses.

Another object of this invention is frequency and phase comparator, which responds to input signal pulses when the frequency of input reference pulses is higher harmonic frequency of the input signal pulses. The highest harmonic frequency of the input reference pulses may be several decades higher than the frequency of the input signal pulses.

For a better understanding of the invention together with other and further objects thereof, reference is had to the following description taken in conjunction with the accompanying drawing. The scope of the invention is pointed out in the appended claims.

In the drawing,

FIG. 11 is a schematic diagram of the circuit generating output two phase pulses.

FIG. 13 is a diagram of the output two phase pulses of difference frequency.

FIG. 14 is a schematic diagram of the electronic combinational switch.

FIG. 16 is a schematic diagram of the signal converter comprising a master and slave divide-by-two connection.

Figure 1:
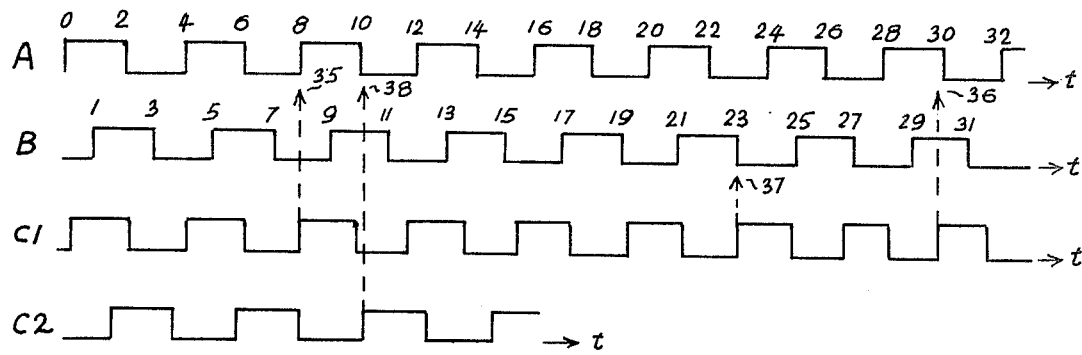
FIG. 1 is a time diagram of input reference pulses, input phase shifted reference pulses, and input signal pulses, which are applied to the input terminals of the frequency and phase comparator.

Reference is made to FIG. 1, now, wherein there is shown a time diagram of input reference pulses in the first row A. The numerals above each rising and falling edge of pulses denote successive quarter periods. The input phase shifted reference pulses B are shown in the second row. The input signal pulses C are shown in the rows C1 and C2.

There is an important fact shown in the rows A and C1. When the period of input signal pulses C1 is shorter than the period of input reference pulses A, every successive rising edge of input signal pulses C1 occurs sooner than the previous one, in respect to the pulses A. Thus, in FIG. 1, the rising edge of the pulses C1 is slowly moving to the left in respect to the pulses A and the number of crossing full periods of pulses A in one second equals the difference frequency. As shown in FIG. 1, the third rising edge of pulses C1 crossed the eighth quarter period of pulses A, wherein the rising edge of input reference pulses A occurs, as indicated by an arrow 35. But, in respect to pulses C1, this rising edge of pulses A is seen as falling edge, because of relative moving from the right to the left. Similarly, the nineth rising edge of input signal pulses C1 crossed the 30th quarter period of input reference pulses A, as indicated by an arrow 36, and the falling edge is seen as a rising edge. It is shown that the seventh rising edge of input signal pulses C1 crossed the 23rd quarter period, as indicated by an arrow 37, wherein the falling edge of the input phase shifted reference pulses occurs.

Input signal pulses in the row C2 have period longer than the input reference pulses A and the rising edges of pulses C2 are moving to the right in respect to the input reference pulses. There is shown a third rising edge of pulses C2 crossing the 10th quarter period, as indicated by an arrow 38, wherein the input reference pulses A have falling edge and this is seen also as falling edge in respect to moving of the edges of pulses C2.

The conversion of the rising edges of input reference pulses A to the falling edges and, vice versa, the falling edges to rising edges occurs, whenever the frequency of the input signal pulses C is higher than the frequency of input reference pulses A.

Figure 2:
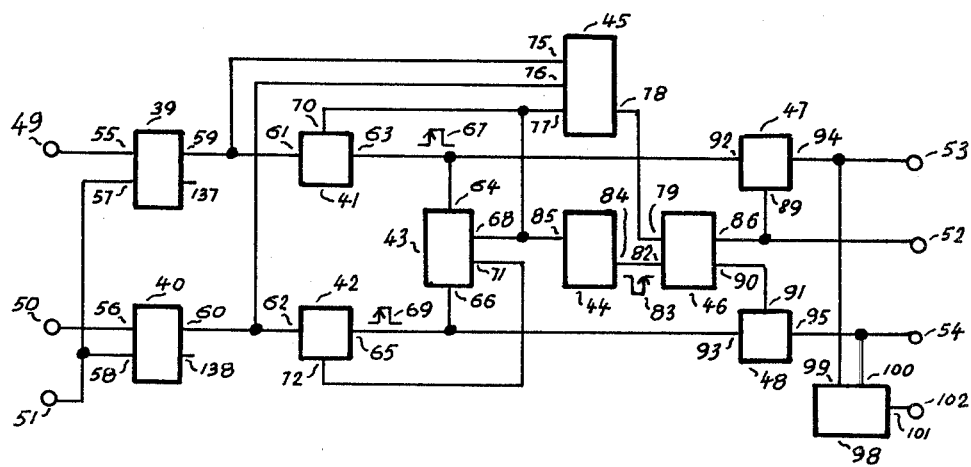
FIG. 2 is a schematic diagram of the frequency and phase comparator.

Now, when the input pulses are defined, reference is made to FIG. 2, wherein the schematic diagram of the frequency and phase comparator is depicted. According to this invention, the comparator consists of an interconnection of a first edge triggered D type flip flop 39, a second edge triggered D type flip flop 40, a first gated pulse generating circuit 41, a second gated pulse generating circuit 42, a set/reset latch 43, a pulse generating circuit 44, a three input combinational logic circuit 45, a third edge triggered D type flip flop 46, a first gating circuit 47, a second gating circuit 48, a first input terminal 49 for applying input reference pulses A, a second input terminal 50 for applying input phase shifted reference pulses B, a third input terminal 51 for applying the input signal pulses C, an output terminal 52, wherein there is produced a sign signal, an another output terminal 53, on which output pulses of difference frequency are produced when the sign signal is in a logical state zero, and another output terminal 54, on which output pulses of difference frequency are produced when the sign signal is in a logical state one. The first input terminal 49 is connected to a D input 55 of the first edge triggered D type flip flop 39, the second input terminal 50 is connected to a D input 56 of the second edge triggered D type flip flop 40, and third input terminal 51 is connected to clock inputs 57 and 58 of both, the first 39 and the second 40 edge triggered D type flip flops, respectively. The rising edges of input signal pulses C applied to the third input terminal 51 trigger both edge triggered D type flip flops at the same time.

In FIG. 2 as well as in all other figures accompanying this description positive logic elements with positive rising triggering edges are shown. It is well known that various other logic elements may be used therein, such as elements triggered by negative going pulse edges and negative logic elements. For explanation the function and better understanding of this invention following description is made for positive logic elements and positive going triggering edges only.

The logical state on a Q output 59 of the first edge triggered D type flip flop 39 is determined by the logical state of input reference pulses A present on the data input 55 at the moment of triggering action. Similarly, the logical state on a Q output 60 of the second edge triggered D type flip flop 40 is determined by the logical state of input phase shifted reference pulses B present on the data input 56 at the moment of triggering action.

By this action the logical states on the outputs 59 and 60 of the edge triggered D type flip flops 39 and 40, respectively, are changed whenever the triggering edges of input signal pulses C are crossing the rising and falling edges of input reference pulses A and input phase shifted reference pulses B and there are created pulses on the outputs 59 and 60 whose frequency is proportional to difference frequency of input reference pulses and input signal pulses.

When the period of input signal pulses C1 is shorter than the period of input reference pulses A, as shown in FIG. 1, the triggering rising edge of input signal pulses C1 moves from the right to the left in respect to input reference pulse A. Thus, the third triggering edge when moved from the logical state one of input reference pulses into new logical state zero, as indicated by the arrow 35, a falling edge of a pulse on the Q output 59 is created in spite of crossing the rising edge of input reference pulses. Similarly, when 9th rising edge of input signal pulses C1 occurs after crossing the falling edge of input reference pulses A, as shown in FIG. 1 by the arrow 36, a rising edge of a pulse is created on the Q output 59.

When the period of input signal pulses C2 is longer than the period of input reference pulses A and the triggering edge of input signal pulses C2 moves from the left to the right in respect to the input reference pulses A, then after crossing a rising edge of input reference pulses A, there is generated a rising edge of a difference pulse on the Q output 59 and similarly the crossing of a falling edge of input reference pulses A generates a falling edge of difference pulses.

Depicted reversing of rising and falling edges of pulses on the Q output 59 of the first edge triggered D type flip flop 39 in respect to rising and falling edges of input reference pulses A occurs everytime, whenever the direction of shifting of the triggering edge changes. The same reversing under the same conditions occurs on the Q output 60 of the second edge triggered D type flip flop 40 in respect to input phase shifted reference pulses B. Thus, when triggering rising edge of input signal pulses C is shifted across several periods of input reference pulses A to the left and then backwards to the right across the same number of periods, there is counted a different number of pulses on the Q output 59.

When the difference of frequency of input reference pulses and input signal pulses is close to zero, or when the frequency of input reference pulses equals the frequency of input signal pulses and the phase of input signal pulses is changing only, there is a large number of triggering edges of input signal pulses repeatedly contained in one period of input reference pulses. When the position of this triggering edge of input signal pulses C is close to rising or falling edge of input reference pulses, the noise, which modulates the period of input reference pulses and input signal pulses, starts to influence the pulse generation on the Q output 59 of the first edge triggered D type flip flop 39. Similar imperfect action occurs on the output 60 of the second edge triggered D type flip flop 40.

There are provisions made in the frequency and phase comparator according to the invention, which prevent the depicted imperfect action. As shown in FIG. 2, the Q output 59 of the first edge triggered D type flip flop 39 is connected to an input 61 of the first gated pulse generating circuit 41 and the Q output 60 of the second edge triggered D type flip flop 40 is connected to an input 62 of the second gated pulse generating circuit 42. An output 63 of the first gated pulse generating circuit 41 is connected to a set input 64 of the set/reset latch 43 and the output 65 of the second gated pulse generating circuit 42 is connected to a reset input 66 of the set/reset latch 43.

A short pulse 67 is generated on the output 63 of the first gated pulse generating circuit 41 everytime, whenever changes in logical state on the Q output 59 of the first edge triggered D type flip flop 39 occur, independently upon the direction of transition from one logical state to the other one. The generated short pulse 67 being applied to the set input 64 of the set/reset latch 43 sets a Q output 68 into the logical state one, under supposition that the precedent logical state was zero. A small arrow pictured on the pulse 67 denotes the triggering edge which is active in setting the set/reset latch 43.

Similarly, a short pulse 69 is generated on the output 65 of the second gated pulse generating circuit 42 when transition in logical states on the output 60 of the second edge triggered D type flip flop 40 occurs and this short pulse 69 applied to the reset input 66 of the set/reset latch 43 resets the Q output 68 into the logical state zero, if precedent logical state was one.

The width of generated short pulses 67 and 69 is chosen according to the kind of used set/reset latch 43, being given by the necessity of duration of set and reset pulses to perform set and reset action.

By this way the Q output 68 of the set/reset latch 43 is alternatively switched into the logical states one and zero and it is independent on illegal pulses generated by the noise content in the input pulses and produced on the output 59 and the output 60 of the first 39 and the second 40 edge triggered D type flip flops, respectively.

When the width of generated pulses 67 is longer than necessary for setting the set/reset latch 43, it is automatically restricted by resetting action on a gating input 70 of the first gated pulse generating circuit 41. This gating input is connected to the Q output 68 of the set/reset latch 43 in a feed-back loop. Similarly, the width of generated pulses 69 on the output 65 of the second gated pulse generating circuit 42 is restricted by a feed-back connection of a Q output 71 of the set/reset latch 43 to the gating input 72 of the second gated pulse generating circuit 42.

Figure 3:
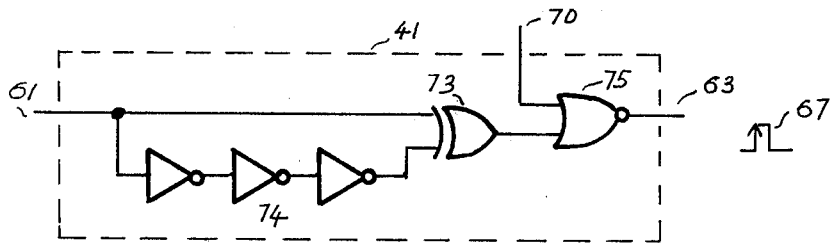
FIG. 3 is a schematic diagram of the gated pulse generating circuit.

Almost any type of gated pulse generating circuit may be used in place of circuit 41 and 42, such as edge triggered resettable monovibrator, but preferably the circuit according to FIG. 3 is used. It consists of an exclusive-or gate 73, an iverting delay circuit 74, and a nor gate 75. The input 61, the output 63 and the gating input 70 are indicated in correspondence with the first gated pulse generating circuit 41. The second gated pulse generating circuit 42 is identical with the first one, except that the inputs and the output are signed as 62,72, and 65. When signal on the gating input 70 is in the logical state zero, then every change of logical state acting on the input 61 generates a pulse 67 on the output 63, whose width is determined by the delay in the delay circuit 74. It is obvious that various changes and modifications of the circuit in FIG. 3 may be made preserving the gated pulse generating function.

Figure 4:
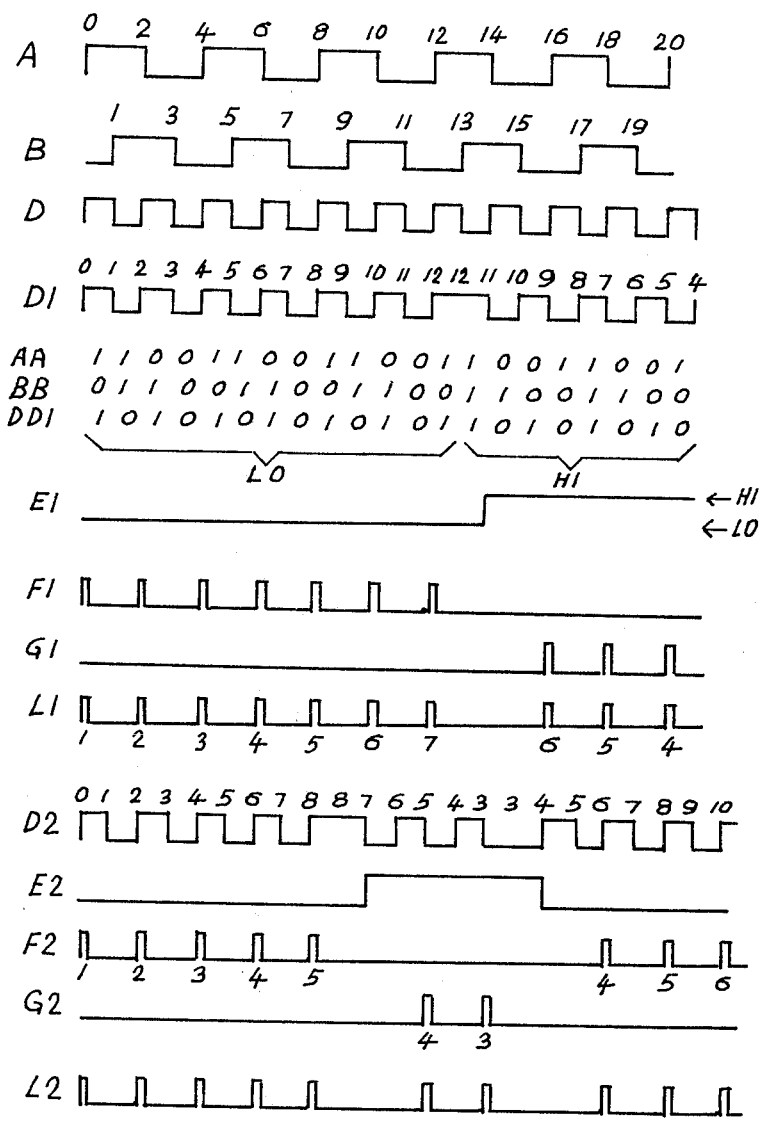
FIG. 4 is a diagram showing the relation between input reference pulses and pulses in various points of the schematic diagram of the frequency and phase comparator.

Now, reference is made to FIG. 4 wherein there is shown relation between input reference pulses A, input phase shifted reference pulses B and pulses in various points in the schematic diagram of the frequency and phase comparator.

Input reference pulses A acting on the first input 49 of the frequency and phase comparator are shown in the first row. Numerals above the pulses denote successive quarter periods of input reference pulses. Input phase shifted reference pulses B acting on the second input terminal 50 are shown in the second row.

When the frequency of input signal pulses C, not shown in FIG. 4, applied to the third input terminal 51 is lower than the frequency of the input reference pulses A, the triggering edge crosses the input reference pulses A from the left to the right and short pulses 67 and 69 are alternatively generated and the set/reset latch 43 is alternatively set and reset. By this way, pulses are generated on the Q output 68 of the set/reset latch 43 as shown in the row D in FIG. 4. The frequency of these pulses D equals twice the difference frequency.

There is a different relation between pulses produced on the Q output 68 of the set/reset latch 43 and input reference pulses A, when the period of input signal pulses is shorter than the period of input reference pulses and when the triggering edges of input signal pulses C are crossing the input reference pulses A from the right to the left. There are shown pulses generated on the Q output 68 of the set/reset latch 43 in the row D1, when the triggering edge of the input signal pulses is moving from the left to the right in respect to the input reference pulses and after entering the 12th quarter period the triggering edge started to move from the right to the left recrossing the 11th, 10th, 9th etc. quarter periods, as the numerals above the edges of pulses D1 indicate.

In the row AA is shown logical state of input reference pulse A for each quarter period and similarly the logical state of input phase shifted reference pulses B is shown in the row BB. Logical state of pulses D1 is shown in the row DD1.

The three binary numbers in every quarter period denote eight various possibilities in relation of these pulse sequencies, four of them synonymously determine that the period of input signal pulses C is shorter than the period of input reference pulses A, as marked HI in FIG. 4, and other four of them synonymously determine that the period of input signal pulses C is longer than the period of input reference pulses A, as marked by LO. It is evident that these logical states determine the sign signal of difference frequency indicating that the frequency of input signal pulses is higher, HI, or lower, LO than the frequency of input reference pulses.

Figure 5:
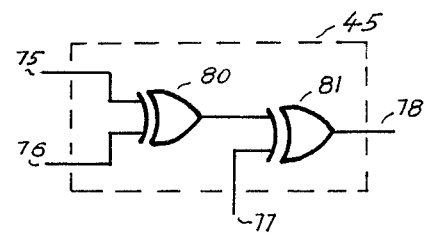
FIG. 5 is a schematic diagram of the three input combinational logic circuit.

Referring again to FIG. 2 wherein there is shown a three input combinational logic circuit 45, whose first input 75 is connected to the Q output 59 of the first edge triggered D type flip flop 39, second input 76 is connected to the Q output 60 of the second edge triggered D type flip flop 40, and third input 77 is connected to the Q output 68 of the set/reset latch 43, and whose output 78 is connected to a data input 79 of the third edge triggered D type flip flop 46. There is a logical state zero on the output 78 of the three input combinational logic circuit 45, whenever its three inputs 75,76,77 correspond with the logical state LO in FIG. 4 and there is the logical state one on the output 78, whenever its logical inputs correspond with the logical state HI. Logic circuit performing the depicted combinational logic function is essentially a three input ExclusiveOr gate, as shown in FIG. 5. The logical states AA and BB are ex-ored in a first Exclusive-Or gate 80 and this result is again ex-ored with the logical state DD1 in a second Exclusive-Or gate 81. It is obvious that various changes and modifications can be made inside the three input combinational logic circuit 45, such as interchanging different inputs or using different logic elements, without departing from this invention as far as three input combinational logic circuit 45 performs three input ex-oring function.

Figure 6:
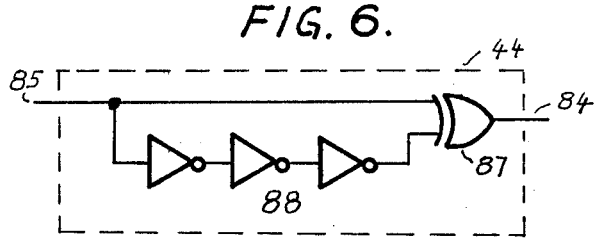
FIG. 6 is a schematic diagram of the pulse generating circuit.

The sign signal on the output 78 of the three input combinational logic circuit 45 is loaded with illegal pulses generated by the noise content in the input pulses of the frequency and phase comparator. The illegal pulses are inhibited in a third edge triggered D type flip flop 46, whose clock input 82 is activated by the tail edges of short pulses 83 generated in a pulse generating circuit 44, whose output 84 is connected to the clock input 82 of the third edge triggered D type flip flop 46 and whose input 85 is connected to the output 68 of the set/reset latch 43. By this way, every logical transition present on the output 68 of the set/reset latch 43 generates a short pulse 83, which triggers third edge triggered D type flip flop 46 and a correct logical state is set on its Q output 86. In FIG. 6 is shown an illustrative embodiment of the pulse generating circuit 44 consisting of an Exclusive-Or gate 86 and an inverting delay element 88.

The Q output 86 of the third edge triggered D type flip flop 46 is connected to the output terminal 52 and there is the sign signal produced on this terminal, according to the row E1 in FIG. 4. There is shown in FIG. 4 that the sign signal is changed after recrossing to 11th quarter period of the reference pulses A. As shown in FIG. 2, the Q output 86 of the third edge triggered D type flip flop 46 is connected to the gating input 89 of the first gating circuit 47 and the $\overline{Q}$ output 90 of the third edge triggered D type flip flop 46 is connected to the gating input 91 of the second gating circuit 48. The input 92 of the first gating circuit 47 is connected to the output 63 of the first gated pulse generating circuit 41 and the input 93 of the second gating circuit 48 is connected to the output 65 of the second gated pulse generating circuit 42. When the signal on the gating input 89 is in the logical state zero the first gating circuit 47 is enabled to transmit short pulses 67, generated by the first gated pulse generating circuit 41 to its output 94, which is connected to an output terminal 53. Similarly, the logical state zero present on the $\overline{Q}$ output 90 of the third edge triggered D type flip flop 46 enables the second gating circuit 48 to transmit short pulses 69 generated in the second gated pulse generating circuit 42 to the output 95 and to an output terminal 54.

Figure 7:
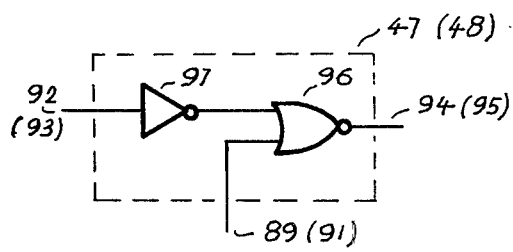
FIG. 7 is a schematic diagram of the first and second two input logic circuit.

In FIG. 7 is shown a schematic diagram on the first gating circuit 47 consisting of a two input logic circuit, which comprises a nor gate 96 and an inverter 97. The second gating circuit 48 is essentially the same, except that the inputs 92 and 89 are replaced by the inputs 93 and 91, respectively, and the output 94 is replaced by the output 95, as indicated in parenthesis.

By this way, pulses 67 are transmitted to the output terminal 53 whenever the frequency of input signal pulses C is lower than the frequency of input reference pulses A, as shown in the row F1 in FIG. 4 and pulses 69 are transmitted to the output terminal 54 whenever the frequency of input signal pulses C is higher than the frequency of input reference pulses A, as shown in the row G1.

Figure 8:
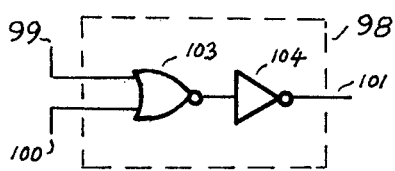
FIG. 8 is a schematic diagram of the two input adding circuit.

Another object of this invention is a connection of a two input adding circuit 98 between an output terminal 102 and the first and second gating circuits 47,48. As shown in FIG. 8, the two input adding circuit 98 consists of a nor gate 103 having a first input 99 connected to the output 94 of the first gating circuit 47 and a second input 100 connected to the output 95 of the second gating circuit 48 and an inverter 104 having an output 101 connected to an output terminal 102.

By means of this two input adding circuit 98 there is only one output terminal 102 on which there are present combined together both output pulses, F1 and G1 in FIG. 4, as shown in the row L1. The output pulses in the row L1 having twice the difference frequency are increasingly numbered when the sign signal in the row E1 is in the logical state zero and decreasingly numbered when the sign signal of the difference frequency in the row E1 is in the logical state one. In the row D2 there are shown pulses on the Q output 68 of the set/reset latch 43 in the case, when the input signal pulses C on input terminal 51 are moving from the left to the right in respect to the input reference pulses A so long as they enter the 8th quarter period and then they reverse the direction of movement successively recrossing the 7th,6th,5th and 4th quarter periods and after enterring the third quarter period they again change the direction of movement to the right. The corresponding output sign signal produced on the output terminal 52 is shown in the row E2. Output pulses of difference frequency on the output terminal 53 and on the output terminal 54 are shown in the rows F2 and G2, respectively. The relative positions of these output pulses in respect to the input reference pulses A are numbered as 1,2,3,4,5, then the pulses in the row G2 are counted backwards to numbers 4 and 3 and after the sign signal changed, the pulses again proceed to position 4, wherein the pulse is correctly located against the 5th quarter period, then to position 5 and 6. Output pulses combined together on the output terminal 102 are shown in the row L2.

In the rows D2, E2, F2, G2 and L2 there is shown a situation in FIG. 4, when the direction of movement of the input signal pulses in respect to the input reference pulses was changed twice. Similarly, sixteen different pulse sequences can be shown, when the direction is changed twice in one full period of input reference pulses and everytime the correct position of the output pulses is achieved.

Reference is made to FIG. 2 again, especially to the first gated pulse generating circuit 41 and the second gated pulse generating circuit 42. It is not necessary to gate and reset these circuits. When the set/reset latch is set by the pulse 67, it is no more influenced by repeatedly applied pulses 67. Similarly, once reset by the pulse 69 the applying another reset pulses 69 remains without any influence. It is obvious that gating inputs 70 and 72 can be omitted and they can be transposed into the first gating circuit 47 and second gating circuit 48, under supposition that the width of generated pulses 67 and 69 is shorter than the width of the pulses 83 generated on the output 84.

Therefore, it is another object of this invention to provide frequency and phase comparator comprising the first pulse generating circuit 105 connected in the place of the first gated pulse generating circuit 41 and having an input 61 and an output 63, the second pulse generating circuit 106 connected in the place of the second gated pulse generating circuit 42 and having an input 62 and an output 65, and further comprising the first gating circuit consisting of a three input logic circuit 107 and the second gating circuit consisting of a three input logic circuit 108.

Figure 9:
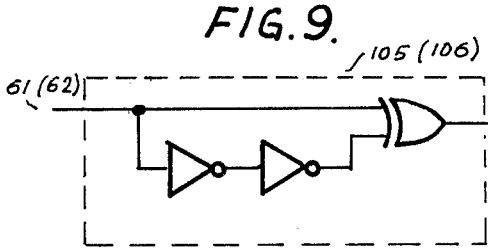
FIG. 9 is a schematic diagram of the first and second pulse generating circuit.

The first pulse generating circuit 105 having the input 61 and the output 63, as shown in FIG. 9, is identical with the pulse generating 44 according to FIG. 6, except that the inverting delay element 88 is replaced by a non-inverting delay element. The second pulse generating circuit 106 is identical with the first one, except that it has input terminal 62 and output terminal 65, as indicated in parenthesis.

Figure 10:
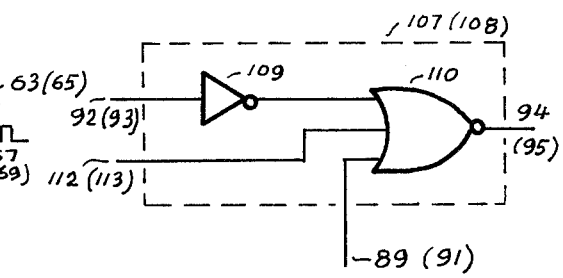
FIG. 10 is a schematic diagram of the first and second three input logic circuit.

An illustrative embodiment of the first gating circuit consisting of the three input logic circuit 107 is shown in FIG. 10. It consists of an inverter 109 and a three input nor gate 110 and it has a first input 92 connected to the output 63 of the first pulse generating circuit 105, a second input 89 connected to the Q output 86 of the third edge triggered D type flip flop 46, and a third input 112, which is connected to the Q output 68 of the set/reset latch 43. The second gating circuit consisting of the three input logic circuit 108 is identical with the first one, except that it has a first input 93 connected to the output 65 of the second pulse generating circuit 106, a second input 91 connected to the $\overline{Q}$ output of the third edge triggered D type flip flop 46, and a third input 113, which is connected to the $\overline{Q}$ output 71 of the set/reset latch 43, as indicated in parenthesis.

It is another important object of this invention to provide the frequency and phase comparator comprising a circuit generating an output two phase pulses having frequency proportional to the difference frequency and phase shift corresponding with the sign of difference frequency. The number of the output two phase pulses is proportional to the number of periods of input reference pulses crossed by input signal pulses during their phase shifting.

The circuit generating above depicted output two phase pulses, as shown in FIG. 11, comprises a first edge triggered pulse generating circuit 114, a second edge triggered pulse generating circuit 115, a third edge triggered pulse generating circuit 116, a forth edge triggered pulse generating circuit 117, a controlled electronic combinational switch 118, a first combinational set/reset latch 119, a second combinational set/reset latch 120, a first output terminal 121, a second output terminal 122, a control input 123, and input terminals 124, 125, 126, 127, 128, and 129.

Figure 12:
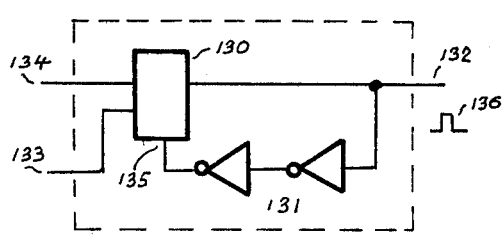
FIG. 12 is a schematic diagram of the edge triggered pulse generating circuit.

Prior to describing the operation of the circuit of FIG. 11, reference is made to FIG. 12, wherein there is shown an illustrative embodiment of an edge triggered pulse generating circuit comprising an edge triggered D type flip flop 130, an non-inverting delay circuit 131, a Q output 132, a clock input 133, a data input 134, and a reset input 135. Delay circuit 131 is connected between the Q output 132 and reset input 135 of the edge triggered D type flip flop 130. A short pulse 136 is generated on the Q output 132 everytime, whenever a signal with logical state one is present on the data input 134 during the triggering action, caused by a rising edge of a pulse acting on the clock input 133. The width of generated pulse 136, determined by the delay circuit 131, is not longer than the width of the pulses 83 generated on the output 84 of the pulse generating circuit 44 in FIG. 2.

In FIG. 11 the clock input 128 of both, the first and the second edge triggered pulse generating circuits 114 and 115, respectively, is connected to the Q output 68 of the set/reset latch 43 in FIG. 2. Data input 124 of the first edge triggered pulse generating circuit 114 is connected to the Q output 59 of the first edge triggered D type flip flop 39 and data input 125 of the second edge triggered pulse generating circuit 115 is connected to the $\overline{Q}$ input 137 of the same edge triggered D type flip flop 39. Similarly, the clock input 129 common to the third and forth edge triggered pulse generating circuit 116 and 117, respectively, is connected to the $\overline{Q}$ output 71 of the set/reset latch 43. Data input 126 of the third edge triggered pulse generating circuit 116 is connected to the Q output 60 of the second edge triggered D type flip flop 40 and data input 127 of the forth edge triggered pulse generating circuit 117 is connected to the $\overline{Q}$ output 138 of the same second edge triggered D type flip flop 40.

Every rising edge of pulses in the row D in FIG. 4 triggers the first and the second edge triggered pulse generating circuits 114 and 115, respectively, at the same time, and short pulses 136 (FIG. 12) are generated on the output 139 of the first one 114, whenever the triggering rising edge of pulses D corresponds with the logical state one of input reference pulses A, and short pulses 136 are generated on the output 140 of the second one 115, whenever the triggering rising edge of pulses D corresponds with the logical state zero of input reference pulses A. Similarly, every falling edge of pulses D triggers the third and the forth edge triggered pulse generating circuits 116 and 117, respectively, at the same time, and short pulses 136 are generated on the output 141 of the third one 116, whenever the falling edge of pulses D corresponds with the logical state of input phase shifted reference pulses B, and short pulses 136 are generated on the output 142 of the forth one 117, whenever the falling edge of pulses D corresponds with the logical state zero of input phase shifted reference pulses B. By this action, the rising and falling edges of input reference pulses A and input phase shifted reference pulses B are separated into four channels and they repeate with difference frequency.

There are generated output reference pulses having difference frequency on the Q output 121 of the first combinational set/reset latch 119, when the set input 143 and the reset input 144 are connected to proper outputs of two of four edge triggered pulse generating circuits by means of electronic combinational switch 118. Similarly, there are generated output phase shifted pulses having difference freuqncy on the Q output 122 of the second combinational set/reset latch 120, when the set input 145 and the reset input 146 are properly connected to another two outputs of the edge triggered pulse generating circuits.

There is shown such a position of the electronic combinational switch 118 in FIG. 11 that the set input 143 of the first combinational set/reset latch 119 is connected to the output 139 of the first edge triggered pulse generating circuits 114 and the reset input 144 to the output 140 of the second edge triggered pulse generating circuit 115, the set input 145 of the second combinational set/reset latch 120 is connected to the output 141 of the third edge triggered pulse generating circuit 116 and reset input 146 to the output 142 of the forth edge triggered pulse generating circuit 117. This position of the combinational switch is determined by a controlling signal acting on the control input 123, which controlling signal corresponds with the sign signal on the Q output 86 of the third edge triggered D type flip flop 46 in FIG. 2. The position of the electronic combinational switch 118 shown in FIG. 11 indicates that the frequency of input signal pulses C is lower than the frequency of input reference pulses A and the output phase shifted pulses produced on the Q output 122 of the second combinational set/reset latch 120 lag the output reference pulses produced on the Q output 121 of the first combinational set/reset latch 119.

The combinational switch 118 connects the set input 143 and reset input 144 of the first combinational set/reset latch 119 to the outputs 142 and 141, respectively, and set input 145 and reset input 146 of the second combinational set/reset latch 120 to the outputs 139 and 140, respectively, when the frequency of input signal pulses C is higher than the frequency of input reference pulses A, and the output phase shifted pulses of difference frequency on the Q output 122 lead the output reference pulses on the Q output 121.

In FIG. 13 are shown various pulse sequences of the output two phase pulses and their relation to the input reference pulses in the row A and the input phase shifted reference pulses in the row B. The numerals above the edges of pulses denote successive quarter periods. In the rows M and N are shown output two phase pulses on the Q output 121 and 122, when the frequency of input signal pulses C is lower than the frequency of input reference pulses A as long as the 8th quarter period is entered, then the frequency of input signal pulses C is higher than the frequency of input reference pulses A, untill the zeroth edge of input reference pulses is crossed and then again the frequency of input signal pulses is lower than the frequency of input reference pulses. The arabic numerals in the rows M and N denote successive quarter periods, or successive partial steps, of the output two phase pulses and negative sign before the arabic numerals denotes changed sign signal, or successive backwards partial steps. It is shown in FIG. 13 that the second IV partial step is located against the 8th edge of input reference pulses A in the beginning of the row and the same IV partial step near the end of the row is correctly located against the same 8th edge of input reference pulses.

Sixteen different pulse sequence similar to those shown in the rows M and N can be shown, because there are 16 different combinations in the pulse sequences when the sign signal changes two times in a two period time interval. Everytime the correct position of quarter periods of output two phase pulses in respect to input reference pulses is achieved.

It is obvious to those skilled in the art that several another interconnections of outputs 139, 140, 141, 142 of the first, second, third and forth edge triggered pulse generating circuits 114, 115, 116, and 117, respectively, and the set inputs 143, 145 and reset inputs 144, 146 of the first and second combinational set/reset latches 119, 120, respectively, can be made with the same results. Such another interconnections may include: interchanging outputs 139 and 140, interchanging outputs of the third and forth edge triggered pulse generating circuits 116 and 117, using $\overline{Q}$ outputs of the first and second combinational set/reset latches 119 and 120, interchanging set input 145 and reset input 146, interchanging set input 143 and reset input 144, and other similar changes, all being without departing from this invention.

In FIG. 14 there is shown an illustrative embodiment of the electronic combinational switch 118 comprising transmission gates 147 and an inverter 148. The control input 123 is connected to the Q output 86 of the third edge triggered D type flip flop 46. The four inputs of the transmission gates are connected to outputs 139, 140, 141, 142 of the edge triggered pulse generating circuits 114, 115, 116, 117, respectively, and the four outputs of transmission gates are connected to the set input 143, reset input 144 of the first combinational set/reset latch 119 and to the set input 145, reset input 146 of the second combinational set/reset latch 120, respectively.

It is obvious that the inverter 148 can be omitted and its output 149 can be replaced by the $\overline{Q}$ output 90 of the third edge triggered D type flip flop 46, and that another combinations of different logical elements can be implemented inside the electronic combinational switch 118 performing above depicted switching function without departing from this invention.

The output two phase pulses of this frequency and phase comparator having frequency proportional to the difference frequency of input reference pulses and input signal pulses and the phase shift proportional to sign of the difference frequency may be used as an input signal for controlling the speed and direction of rotation of a two phase stepping motor.

Input two phase reference pulses must be applied to first input terminal 49 and to second input terminal 50 of the frequency and phase comparator according to FIG. 2.

Figure 15:
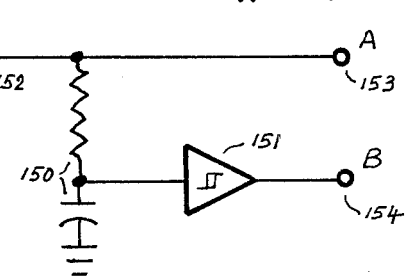
FIG. 15 is a schematic diagram of the signal converter comprising a phase shifting network.

It is another object of this invention to provide an input signal converter for obtaining input two phase reference pulses from simple input reference signal. Input signal converter has an input terminal for applying input reference signal AB and two output terminals to present the input reference pulses A and the input phase shifted reference pulses B. In FIG. 15 is shown an illustrative schematic diagram of the signal converter consisting of an RC phase shifting network 150 and a Schmitt circuit 151. Input reference signal AB is applied to an input terminal 152, input reference pulses A are present on a first output terminal 153, which is connected to the first input terminal 49 of the frequency and phase comparator, and input phase shifted reference pulses B are present on a second output terminal 154, which is connected to the second input terminal 50 of the frequency and phase comparator. The signal converter according to FIG. 15 may be used, when the frequency of input reference signal is not variable.

When the frequency of input reference signal changes, an input signal converter according to FIG. 16 is suitable. This input signal converter consists of a master divide-by-two circuit comprising an edge triggered D type flip flop 155, a slave divide-by-two circuit comprising an edge triggered D type flip flop 156 and an inverter 157. Input reference signal AB is applied to an input terminal 158, the input reference pulses A of half the frequency are produced on a Q output 159 of the edge triggered D type flip flop 155, and this Q output 159 is connected to the first input terminal 49 of the frequency and phase comparator, the input phase shifted reference pulses B of half the frequency are produced on a Q output 160 of the edge triggered D type flip flop 156, and this Q output 160 is connected to the second input terminal 50 of the frequency and phase comparator. Master divide-by-two circuit is a known connection of an edge triggered D type flip flop for dividing by two, in the slave divide-by-two circuit the data input 161 of the edge triggered D type flip flop 156 is connected to the $\overline{Q}$ output 162 of the edge triggered D type flip flop 155. The clock input 163 of the edge triggered D type flip flop 156 is connected to the input terminal 158 by means of an inverter 157 and therefore it is triggered by falling edges of input reference signal AB. By this means, the pulses on the output 160 always lag the pulses on the output 159.

The frequency of output pulses of the frequency and phase comparator present on output terminals 53, 54 and 102 is twice the difference frequency of input reference pulses A and input signal pulses C, but it is the difference frequency of input reference signal AB and input signal pulses C, when the input signal converter according to FIG. 16 is used.

While there have been described what are considered to be preferred embodiments of the invention, it will be obvious to those skilled in the art that various changes and modifications may be made therein without departing from the invention and it is, therefore, aimed in the appended claims to cover all such changes and modifications as fall within the spirit and scope of the invention.

What is claimed as new and desired to be secured by Letters Patent of the United States is:

1. A frequency and phase comparator wherein the electronic circuit comprises a first edge triggered D type flip flop, a second edge triggered D type flip flop, a set/reset latch, first means connected between an output of said first edge triggered D type flip flop and a set input of said set/reset latch, second means connected between an output of said second edge triggered D type flip flop and a reset input of said set/reset latch, a pulse generating circuit connected to an output of said set/reset latch, a third edge triggered D type flip flop with output means, an edge triggered clock input of said third edge triggered D type flip flop being connected to an output of said pulse generating circuit and a data input of said third edge triggered D type flip flop being connected to an output of a three input combinational logic circuit, a first input of said three input combinational logic circuit being connected to said output of the first edge triggered D type flip flop, a second input of said three input combinational logic circuit being connected to said output of the second edge triggered D type flip flop, a third input of said three input combinational logic circuit being connected to said output of said set/reset latch, (output means for producing output pulses) first input means (for applying input reference pulses) connected to a data input of said of said first edge triggered D type flip flop and (input phase shifted reference pulses) to a data input of said second edge triggered D type flip flop, second input means (for applying input signal pulses) connected to an edge triggered clock inputs of said first edge triggered D type flip flop and of said second edge triggered D type flip flop.

2. A frequency and phase comparator as defined in claim 1, wherein said output means comprise a first gating circuit, an output of said first gating circuit being connected to an output terminal for producing output pulses, a second gating circuit, an output of said second gating circuit being connected to an output terminal for producing output pulses.

3. A frequency and phase comparator as defined in claim 1, wherein said output means (comprise an output terminal) connected to an output of said third edge triggered D type flip flop consist of an output terminal (for producing an output sign signal).

4. A frequency and phase comparator as defined in claim 2 wherein said output means comprise a two input adding circuit, a first input of said two input adding circuit being connected to an output of said first gating circuit, a second input of said two input adding circuit being connected to an output of said second gating circuit, an output of said two input adding circuit being connected to an output terminal for producing output pulses.

5. A frequency and phase comparator as defined in claim 2 wherein said first gating circuit comprises a two input logic circuit, a signal input of said two input logic circuit being connected to an output of said first means, a gating input of said two input logic circuit being connected to an output of said third edge triggered D type flip flop for applying a gating signal enabling a transmission of short pulses from said signal input to said output, and wherein said second gating circuit comprises a two input logic circuit, a signal input of said two input logic circuit being connected to an output of said second means, a gating input of said two input logic circuit being connected to an inverted output of said third edge triggered D type flip flop for applying a gating signal enabling a transmission of short pulses from said signal input to said output.

6. A frequency and phase comparator as defined in claim 1, wherein said three input combinational logic circuit comprises a combination of logic gates performing a three input exclusive-or function.

7. A frequency and phase comparator as defined in claim 1, wherein said first means comprise a first gated pulse generating circuit having a signal input connected to said output of the first edge triggered D type flip flop and producing short pulses whenever a logical state on said signal input changes, and having a gating input connected to said output of said set/reset latch for applying a gating signal inhibiting a transmission of said short pulses to an output of said first gated pulse generating circuit, further wherein said second means comprise a second gated pulse generating circuit having a signal input connected to said output of the second edge triggered D type flip flop and producing short pulses whenever a logical state on said signal input changes, and having a gating input connected to an inverted output of said set/reset latch for applying a gating signal inhibiting a transmission of said short pulses to an output of said second gated pulse generating circuit.

8. A frequency and phase comparator as defined in claim 1, wherein said first means comprise a first pulse generating circuit having a signal input connected to said output of the first edge triggered D type flip flop and producing short pulses on an output whenever a logical state on said signal input changes, further wherein said second means comprise a second pulse generating circuit having a signal input connected to said output of the second edge triggered D type flip flop and producing short pulses on an output whenever a logical state on said signal input changes.

9. A frequency and phase comparator as defined in claim 2, wherein said first gating circuit comprises a three input logic circuit, a first input being connected to an output of said first means, a second input being connected to an output of said set/reset latch for applying a first gating signal, a third input being connected to said output of said third edge triggered D type flip flop for applying a second gating signal, said first gating signal and said second gating signal enabling a transmission of short pulses from said first input to an output, further wherein said second gating circuit comprises a three input logic circuit, a first input being connected to an output of said second means, a second input being connected to an inverted output of said set/reset latch for applying a first gating signal, a third input being connected to an inverted output of said third edge triggered D type flip flop for applying a second gating signal, said first gating signal and said second gating signal enabling a transmission of short pulses from said first input to an output.

10. A frequency and phase comparator as defined in claim 1, wherein said output means comprise a first edge triggered pulse generating circuit having a data input connected to said output of said first edge triggered D type flip flop and an edge triggered clock input connected to said output of said set/reset latch, a second edge triggered pulse generating circuit having a data input connected to an inverted output of said first edge triggered D type flip flop and an edge triggered clock input connected to said output of said set/reset latch, a first pair of outputs including an output of said first edge triggered pulse generating circuit and an output of said second edge triggered pulse generating circuit, a third edge triggered pulse generating circuit having a data input connected to said output of said second edge triggered D type flip flop and an edge triggered clock input connected to an inverted output of said set/reset latch, a forth edge triggered pulse generating circuit having a data input connected to an inverted output of said second edge triggered D type flip flop and an edge triggered clock input connected to said inverted output of said set/reset latch, a second pair of outputs including an output of said third edge triggered pulse generating circuit and an output of said forth edge triggered pulse generating circuit, further said output means comprise an electronic combinational switch, a first combinational set/reset latch having an output connected to a first output terminal, a second combinational set/reset latch having an output connected to a second output terminal, wherein said first and said second output terminals produce a two phase output.

11. A frequency and phase comparator as defined in claim 10, wherein said electronic combinational switch comprises a first pair of inputs connected to said first pair of outputs, a second pair of inputs connected to said second pair of outputs, a first output connected to a set input of said first combinational set/reset latch, a second output connected to a reset input of said first combinational set/reset latch, a third output connected to a set input of said second combinational set/reset latch, a forth output connected to a reset input of said second combinational set/reset latch, a control input connected to the output of the third edge triggered D type flip flop for applying a controlling signal, wherein said controlling signal being in a first logical state enables said electronic combinational switch for connecting said first output and said second output to said first pair of inputs and said third output and said forth output to said second pair of inputs, and wherein said controlling signal being in a second logical state enables said electronic combinational switch for connecting said first output and said second output to said second pair of inputs and said third output and said forth output to said first pair of inputs.

12. A frequency and phase comparator as defined in claim 1, wherein said second input means comprise a third input terminal connected to said edge triggered clock inputs of said first edge triggered D type flip flop and of said second edge triggered D type flip flop for applying input signal pulses.

13. A frequency and phase comparator as defined in claim 1, wherein said first input means comprise a first input terminal connected to said data input of said first edge triggered D type flip flop for applying input reference pulses and a second input terminal connected to said data input of said second edge triggered D type flip flop for applying input phase shifted reference pulses.

14. A frequency and phase comparator as defined in claim 1, wherein said first input means comprise an input terminal connected to said data input of said first edge triggered D type flip flop for applying input reference pulses and said input terminal connected to a signal converter including a phase shifting network for producing input phase shifted reference pulses and an output connected to said data input of said second edge triggered D type flip flop for applying said input phase shifted reference pulses.

15. A frequency and phase comparator as defined in claim 1, wherein said first input means comprise an input terminal connected to a signal converter, wherein said signal converter comprises a first dividing edge triggered D type flip flop in a master divide-by-two connection having an input connected to said input terminal for applying an input signal and an output connected to said data input of said first edge triggered D type flip flop for applying input reference pulses, further said signal converter comprises a second dividing edge triggered D type flip flop in a slave divide-by-two connection having an input connected to said input terminal by means of an inverter for applying an inverted input signal, an output connected to said data input of said second edge triggered D type flip flop for applying input phase shifted reference pulses and a data input connected to an inverted output of said first dividing edge triggered D type flip flop in the master divide-by-two connection.

* * * * *